United States Patent [19]

Goebel et al.

[11] 4,161,063

[45] Jul. 17, 1979

[54] METHOD OF MAKING A CATHODE FOR AN ELECTROCHEMICAL CELL

[75] Inventors: Franz Goebel, Ashland; Nikola Marincic, Winchester, both of Mass.

[73] Assignee: GTE Laboratories Incorporated, Stamford, Conn.

[21] Appl. No.: 860,699

[22] Filed: Dec. 15, 1977

Related U.S. Application Data

[62] Division of Ser. No. 763,845, Jan. 31, 1977, Pat. No. 4,086,397.

[51] Int. Cl.$^2$ .................... H01M 4/88; H01M 4/96
[52] U.S. Cl. .................... 29/623.5; 264/105; 264/142; 264/143
[58] Field of Search .............. 29/623.1, 623.4, 623.5, 29/730; 264/105, 104, 142, 143, 140, 141; 429/233, 235–237, 239–245, 196, 198, 101, 105

[56] References Cited

U.S. PATENT DOCUMENTS

| | | | |
|---|---|---|---|
| 396,769 | 1/1889 | Sellon | 429/241 |
| 1,899,064 | 2/1933 | Storey et al. | 264/105 |
| 2,419,035 | 4/1947 | Quinn et al. | 264/141 |
| 2,724,733 | 11/1955 | Hagsphil et al. | 429/237 |
| 3,184,339 | 5/1965 | Ellis | 29/623.5 |
| 3,197,527 | 7/1965 | Krummeich | 264/105 |
| 3,385,736 | 5/1968 | Deibert | 264/105 |
| 3,519,485 | 7/1970 | Chassoux et al. | 429/240 |
| 3,907,593 | 9/1975 | Marincic | 429/242 |
| 4,048,715 | 9/1977 | Vissers et al. | 29/623.5 |

Primary Examiner—Francis S. Husar
Assistant Examiner—Daniel C. Crane
Attorney, Agent, or Firm—David M. Keay

[57] ABSTRACT

A carbon cathode structure is described comprising an aggregate of discrete, porous, semi-rigid carbon conglomerates which are impressed from both sides onto a screen-like substrate for physical support thereby. The substrate additionally functions as a current collector by uniformly and electrically contacting the interior of the resulting structure. Electrolyte-conducting channels formed between adjacent conglomerates of the thick, porous cathode structure serve to maximize the cell rate capability and cell discharge capacity.

7 Claims, 3 Drawing Figures

METHOD OF MAKING A CATHODE FOR AN ELECTROCHEMICAL CELL

This is a division of application Ser. No. 763,845 filed Jan. 31, 1977, now U.S. Pat. No. 4,086,397 issued Apr. 25, 1978.

FIELD OF THE INVENTION

The present invention is related generally to electrochemical cells and is more particularly concerned with a novel construction for cells having high discharge capacities.

Cells with high discharge capacities are utilized for a wide variety of applications including portable lighting sources, communications equipment and the like. Since such cells may be required to supply current over extended periods of time, it is desirable to provide the largest discharge capacity per unit volume, hereinafter referred to as energy density, and the highest possible rate capability.

One such electrochemical system characterized by a large energy density of approximately 600 watt-hrs./kg. comprises an alkali metal anode which is typically lithium but may also include sodium, potassium, etc., an electrolyte containing an inorganic solvent selected from the group consisting of phosphorous oxychloride, thionyl chloride, sulfuryl chloride and mixtures thereof, and a solute dissolved in the solvent. The cells additionally comprise a catalytic cathode material selected from gold, carbon and ($C_4F_N$) on which the solvent material is catalytically reduced.

As used throughout the specification and claims, reference to a particular anode or cathode material, shall mean the electrochemically active component of the anode structure or the cathode material upon which the electrochemical reduction of the solvent takes place.

Owing to the unusually large volumetric energy densities of these cells, it is desirable to utilize them for such applications as those indicated above. However, as already stated, such applications require cells having a large discharge capacity and high rate capabilities in addition to large energy densities. Although it is well known in the art that the rate capability of a cell may be increased by increasing the surface areas of the electrodes, since the electrochemical reactions within the cell occur where there is contact between electrolyte and the electrodes, practical limitations exist with respect to the size which the cell may attain.

In the foregoing electrochemical system, the cathode has been found to be the electrochemically weakest component during discharge of the cell. In other words, it is primarily responsible for a drop in cell voltage as the current draw is increased. An electrochemical cell having a high rate capability therefore requires a cathode which will sustain its potential at high current densities.

In U.S. patent application Ser. No. 617,117, filed Sept. 26, 1975, now abandoned assigned to the assignee of the present invention, and incorporated by reference, there is disclosed a porous, preformed three-component cathode material and a method for making same. The cathode material comprises 40 to 99% (by weight) of carbon black, at least 1% of a binder, and graphite. Owing to the pores formed within the material, the electrolytic solution can penetrate the cathode surface and contact interior cathodic particles which thereby provide additional active surface areas to increase the rate capability of the cell, and to additionally increase the cell discharge capacity without increasing the cell size. While the cell discharge capacity may theoretically be further increased by increasing the thickness of the cathodic material, substantial increases do not in fact occur beyond a critical cathode dimension. This limitation has been traced to the clogging of the cathodic pores with discharge products and the consequential blocking of the electrolytic solution from interior cathodic particles, thereby decreasing the active cathode surface area.

In U.S. patent application Ser. No. 614,467, filed Sept. 18, 1975, now U.S. Pat. No. 4,060,668 issued Nov. 29, 1977, assigned to the assignee of the present invention and incorporated by reference, there is disclosed a cathode material comprising an aggregate of discrete porous semi-rigid globules. The porosity of each globule results from its composition and the process by which it is formed. The individual globules each have a multitude of minute pores which allow the electrolytic solution to contact the interior cathodic particles and thereby provide a large active surface area over which the electrolyte may be chemically reduced. In addition to the pores contained within the individual globules, larger fluid-conducting channels, defined between the boundaries of adjacent globules, ensure that the electrolytic solution can diffuse throughout the cathode material and contact the interior cathodic particles to increase cell life. The resulting cathode is characterized by a high utilization which, consequently, increases the cell discharge capacity without an increase in cell size.

As taught in the above-referenced applications, cathodes utilizing these materials and adapted for use in small size electrochemical cells, such as AA, C and D sizes are self-supporting preformed structures made by rolling or extruding a three-component carbon paste into its desired shape. The wet cathodes are then dried and cured at elevated temperatures. These cathodes obtain their physical strength from linkage of binder particles and are generally self-supporting structures because of their small physical size.

Electrochemical cells having the foregoing electrochemical system have conventionally assumed one of two general configurations. The first is a button-type cell, such as that disclosed in U.S. Pat. No. 3,907,593, which is adapted for applications where low discharge currents are required for long periods of time. The second is a cylindrical cell such as that shown in copending U.S. patent application Ser. No. 614,467, filed Sept. 18, 1975. Cylindrical cells, however, have inherent problems when one attempts to adapt that configuration to high discharge capacity cells having high rate capabilities. Thick electrodes such as those needed for high rate cells are rigid and are not easily formed within large cylindrical cells nor bent to follow the curvature of cylindrical containers.

SUMMARY OF THE INVENTION

It is an object of the invention to provide an electrochemical cell with a high discharge capacity and having a novel cathode structure which provides a significantly higher rate capability discharge capacity than heretofore achievable.

It is another object of the invention to provide a thick, porous electrode cathode structure having a large, active surface area and requiring a minimum of volume for inert current collectors.

Accordingly, a high discharge capacity electrochemical cell is disclosed herein having thick, porous, prismatic cathodes which provide a large, active surface area and require a minimal volume for the inert current collecting materials. Porous self-supporting cathodes, such as those described in my above-reference applications, are structurally limited by the mechanical strength of the binder. If the cell is to have a discharge capacity which requires physically large electrodes, these cathode structures may crumble when handled during assembly of the cell or when subjected to physical shock while in the cell. The latter is of particular concern, since intra-cell shorting can occur.

The cathode structure of the instant cell is, therefore, a self-supporting structure comprising a rigid frame member, a metallic substrate having a plurality of interstice-defining members and affixed about its periphery to the frame member, and an aggregate of discrete, semi-rigid, of porous carbon conglomerates defining a network of electrolyte-conducting channels extending throughout the cathode. The conglomerates are impressed on the interstice-defining substrate members for structural support thereby. The substrate members electrically contact the cathode throughout its interior to function as a current collector for the cathode structure.

The conglomerates are formed by mixing a 40 to 99 weight percent of carbon black with at least 1 weight percent of a binder and a quantity of suitable liquid which is sufficient to form a slurry. The slurry is dried to form a semi-rigid, porous structure and broken into a mass of carbon conglomerates which are pressed onto both sides of a rigid, screen-like substrate to form the cathode structure.

These and other features of the invention will be more fully described below in the following Description of the Preferred Embodiment which is to be read in conjunction with the Drawing.

BRIEF DESCRIPTION OF THE DRAWING

In the Drawing.

Corresponding elements in the foregoing figures are identically referenced.

DESCRIPTION OF THE PREFERRED EMBODIMENT

Figure 1:
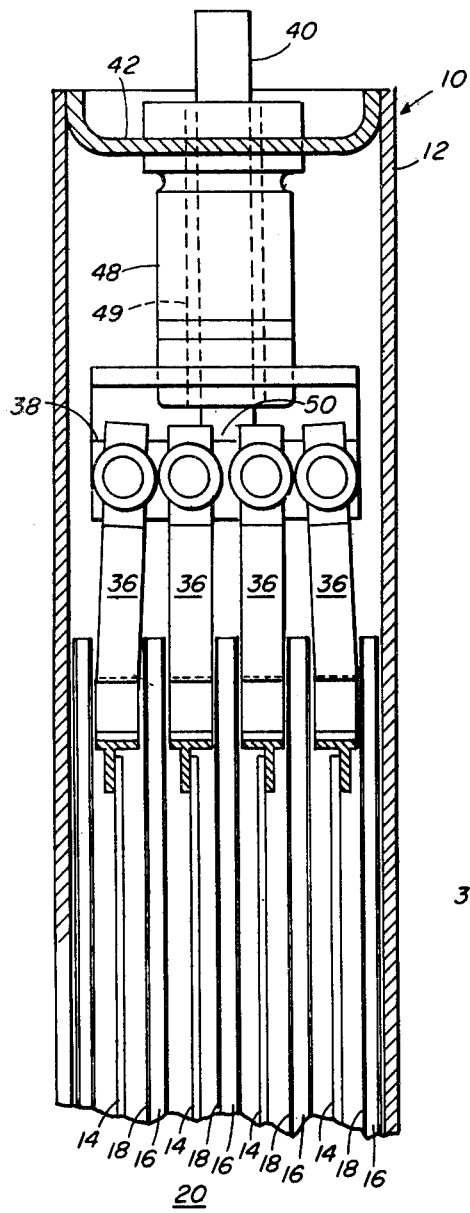
FIG. 1 is a cross-sectional view of an electrochemical cell constructed in accordance with the invention.

Turning initially to FIG. 1, an electrochemical cell, shown generally at 10, comprises an outer casing 12 and an electrochemical system disposed therein. The electrochemical system, in turn, comprises a plurality of alternately arranged anode and cathode structures identified as 14 and 16 respectively, and a thin, porous separators 18, made from an electrically, non-conductive material, disposed between each adjacent anode and cathode to ensure electrical isolation therebetween. The electrochemical system additionally comprises an electrolyte 20 which is diffused throughout the cathode structure 14 and separators 18.

The particular electrochemical system may be selected from any known for which an inert conductive cathode collector material may be found. An example of such an electrochemical system is carbon-zinc system which has a zinc anode, a carbon cathode, and an electrolyte consisting of a moist, aqueous paste of ammonium chloride, zinc chloride, manganese oxide and carbon particles. The system preferably utilized, however, belongs to a recently developed class of electrochemical cells where a lithium, or another alkaline metal, anode is utilized with an electrolytic solution which includes a liquid oxyhalide solvent material and a solute dissolved therein to make the solution ionically conductive. Suitable oxyhalide solvents include those of phosphorous or sulfur, such as phosphorous oxychloride, thionyl chloride, sulfuryl chloride, or mixtures thereof. Such oxyhalide solvent materials additionally function as liquid depolarizers as they are electrochemically reduced on the surface of the cathode material during operation of the cell. Suitable electrochemical systems are set forth in copending application Ser. No. 685,214, filed May 11, 1976 and U.S. Pat. No. 3,923,543.

The anode structure 16 depicted in FIG. 1 is particularly suited for the instant cell and forms the subject matter of a U.S. patent application entitled "Prismatic Anode for an Electrochemical Cell with High Discharge Capacity", Ser. No. 763,848 filed concurrently herewith, now abandoned and hereby incorporated by reference.

Figure 2:
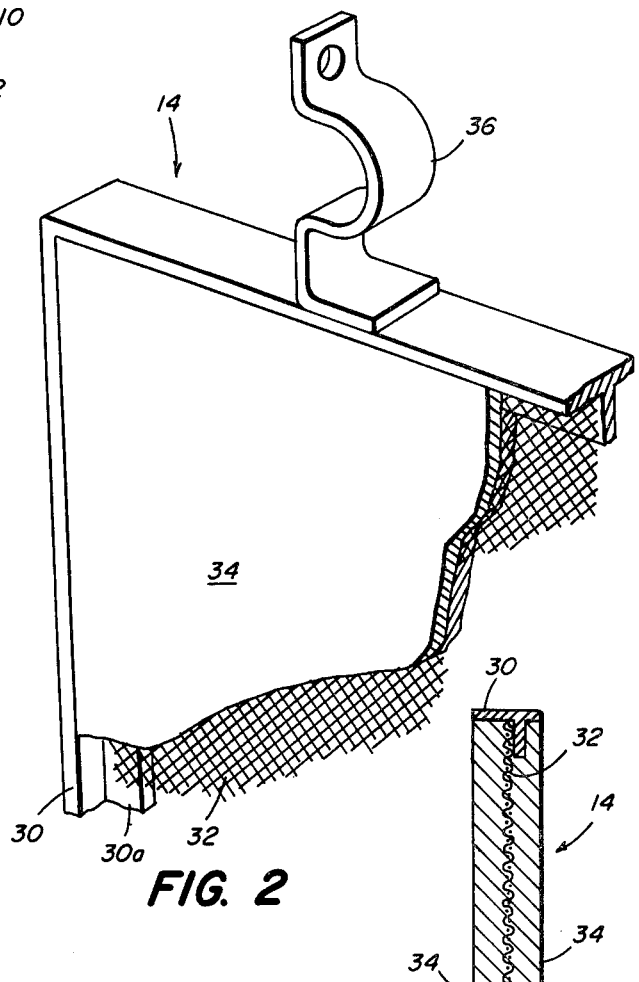
FIG. 2 is an isometric view of a cathode structure constructed in accordance with the invention and utilized in the cell of FIG. 1.
Figure 3:
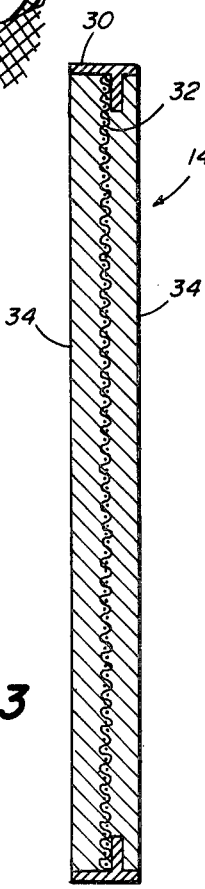
FIG. 3 is a side view in section of the cathode structure of FIG. 2.

The cathode structure 14 depicted in FIGS. 2 and 3 provides a relatively thick structure having the requisite active surface area for a high rate capability cell. The structure 14 comprises an electrically conductive substrate 32 having a plurality of interstice-defining members. The substrate may conveniently be a screen, a sheet of expanded metal, or preferably a sheet of distorted expanded metal. The latter, known by the acronym DISTEX, comprises expanded metal having interstice-defining members which are twisted 90° along each interstice for added structural strength. In the preferred embodiment, the substrate 32 is made from nickel.

Affixed to the periphery of the substrate 32 is a rigid, metallic frame 30. In the preferred embodiment, the substrate is spot welded about its entire periphery to the leg 30a of a "T"-shaped electrically conductive frame as will be more evident below. The resulting structure provides a highly porous cathode current collector which structurally reinforces the cathodic material without inhibiting the diffusion of the electrolyte throughout the cell.

The cathode material 34, generally comprised from a graphite, from about 40 to 99 weight percent of carbon black, and at least 1 weight percent of a binder which is inert in the cell and which is preferably a fluorocarbon polymer such as is sold under the trademark Teflon by DuPont.

The graphite in carbon black utilized in the formation of the cathode material are preferably of commercial grade or better purity. The graphite particle size is preferably maintained below 650 mesh and the carbon black utilized is preferably compressed about 50%. These preferred specifications for the graphite and carbon black are selected to ensure a homogeneous product which will not contribute to a deterioration of the discharge parameters of the cell through the incorporation of reactive impurities therein.

Two examples of the preferred fluorocarbon polymers of particular utility in the present invention, are those identified by the trademarks Teflon and Kel-F. Teflon is a registered trademark of E. I. DuPont de Nemours and Company for tetrofluoroethylene fluorocarbon polymers and fluorinated ethylene-propylene resins. Kel-F is a registered trademark of the 3M Company for a series of fluorocarbon products including polymers of chlorotrifluoroethylene and certain copolymers. The function of fluorocarbon polymer is to stabilize the mechanical strength of the cathode material by forming chain-like connections between the various particles of graphite and carbon black to form a mechanical binding network so that a semi-rigid configuration may be achieved for the cathode material.

The particular composition of the cathode material which is preferred comprises up to 30 weight percent of graphite, 65 to 99 weight percent of carbon black and 1 to 10 percent of fluorocarbon polymer. The particular composition chosen results in cathode material having varying porosity characteristics. The variance in porosity is beneficial because it permits a concomitant variance in the discharge rates available from the resulting primary electrochemical cell.

In the preferred embodiment, the cathodic material 34, is prepared as a dough preferably by dry mixing 350 grams of carbon black with approximately 35 grams of graphite for about 15 hours. Approximately 1.5 liters of a 50% isopropyl solution in water is added to the dry mix to carbon graphite and mixed for approximately 2 additional hours to form a slurry. An amount of binder equal to approximately 5% of the weight of the dry mix is mixed into the slurry until uniformly dispersed therethrough. The resulting dough is extruded into a spaghetti-like form approximately 5 millimeters in diameter and dried for approximately 15 hours at room temperature. Although other methods of shaping the dough may be used, extrusion generally precludes any smearing of the dough surface which adversely effect porosity. The spaghetti is chopped to form a plurality of conglomerates having a length of from 0.1 to 5 millimeters, depending on the size of the cathode. Generally thicker cathodes require larger fluid conducting channels between globules to enable the electrolyte to reach the interior portions of the cathode structure. These larger channels are provided by the use of larger conglomerates. It has been found, by way of example, that a cathode structure such as that illustrated by the numeral 14 having dimensions of 12"×21"×½" performed well with conglomerates having a length of 10 millimeters.

The conglomerates thus formed are impressed onto the substrate 32 from both sides to form a thick, coarse layer of cathodic material covering both sides of the substrate, and the interior periphery of the frame 30. The pores formed within each conglomerate, and the network of fluid-conducting channels defined between adjacent conglomerates, ensures the complete diffusion of electrolyte throughout the thick cathode structure 14 throughout the discharge of the electrochemical cell. It may also be appreciated that the substrate 32, being embedded in the cathodic material and contacting the interior thereof, provides a uniform current distribution over the total cathodic surface area without affecting electrolyte diffusion therethrough.

The net result of the above-described cathode structure, is a large, thick, highly active cathode having good conductivity and material strength. The electrode porosity enhances the rate capability of the cell, while its large physical size and the network of channels maximize the cell discharge capacity.

The cathode structure 14 thus formed, is electrically connected to a cell terminal 40 by means such as a conductive bracket 36 affixed to the outer periphery of the frame 30 and mechanically coupled to a current-collecting cross-bar 38. The terminal 40 is actually the top end of a cylindrical rod which passes through a compression seal 44 in the cover 42 of the cell casing. As is known in the art, compression seals comprise a metallic barrel 48, a rod such as the terminal 40 and a layer 49 of electrically non-conductive insulating material such as a fluorethylene polymer therebetween which electrically insulates the rod from the barrel 48. The barrel 48 is welded to the casing cover 42 to hermetically seal the electrochemical system within the casing 12 when the cover 42 is welded about its periphery thereto. The lower end of the rod 40 forms a lug 50 which may be connected to the current collector cross-bar 38. The cell described herein utilizes parallel electrodes which result in the most uniform current distribution over the electrode surface during discharge. Cells having dimensions of 5×32×40 cm have been found to have a volumetric energy density of 950 W-H/liter, and a discharge capacity of 1900 A-H at a current level of 5–10 A and an average cell voltage of 3.3 volts. The rate capability of the cell is demonstrated by its short-circuit current of 800 A. Other cells have been constructed having discharge capacities of 12,000 A-H and short-circuit currents of 4,000 A.

While there have been shown and described what are considered to be preferred embodiments of the present invention, it will be obvious to those of ordinary skill in the art that various changes and modifications may be made therein without departing from the spirit and scope of the invention as defined by the appended claims.

I claim:

1. A method for constructing a large, highly active cathode electrode for use in an electrochemical cell comprising the steps of:
   forming a porous, semi-rigid dough of cathode material;
   drying the dough;
   breaking up the dried dough to form a mass of discrete porous conglomerates; and
   pressing a quantity of the conglomerates onto a rigid electrically conductive screen-like member so that the conglomerates substantially fill the interstices therein and are structurally supported by the interstice-defining members of the screen-like member.

2. The method of claim 1 wherein the step of forming a porous, semi-rigid dough of cathode material includes mixing carbon black and an isopropanol solution to form a slurry.

3. The method of claim 1 wherein the step of forming a porous, semi-rigid dough of cathode material includes dry-mixing carbon black and graphite.

4. The method of claim 3 wherein an isopropanol solution is added to the resulting dry mixture to form a slurry.

5. The method of claim 2 wherein a binder is added to the slurry to produce said dough.

6. The method of claim 5 wherein the conglomerates are completely cured subsequent to their impressment onto the screen-like member.

7. The method of claim 5 wherein the dough is extruded into a spaghetti-like shape prior to being dried and broken up into conglomerates.

* * * * *